(12) United States Patent
Wang et al.

(10) Patent No.: US 10,360,289 B2
(45) Date of Patent: *Jul. 23, 2019

(54) ENCODED TEXT DATA MANAGEMENT

(71) Applicant: International Business Machines Corporation, Armonk, NY (US)

(72) Inventors: Wendy Ping Wen Wang, Taipei (TW); Hsiao-Yung Chen, New Taipei (TW); Hsiang-Wen Chen, Keelung (TW); Wen-Ping Chi, New Taipei (TW); Hsin Yu Hsieh, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/952,346

(22) Filed: Apr. 13, 2018

(65) Prior Publication Data

US 2018/0322102 A1    Nov. 8, 2018

Related U.S. Application Data

(63) Continuation of application No. 15/584,277, filed on May 2, 2017, now Pat. No. 10,037,309.

(51) Int. Cl.
*H03M 7/30* (2006.01)
*G06F 17/22* (2006.01)

(52) U.S. Cl.
CPC .......... *G06F 17/2217* (2013.01); *H03M 7/70* (2013.01)

(58) Field of Classification Search
CPC .... G06F 17/2217; H03M 7/70; G06K 9/6212; G06K 9/723
USPC ....................................................... 341/107
See application file for complete search history.

(56) References Cited

U.S. PATENT DOCUMENTS

| | | | |
|---|---|---|---|
| 7,584,089 | B2 | 9/2009 | Kuwata et al. |
| 8,874,430 | B2 | 10/2014 | Al-Omari et al. |
| 9,152,904 | B2 | 10/2015 | Khorsheed et al. |
| 9,223,758 | B1 | 12/2015 | Oikawa |
| 10,037,309 | B1 * | 7/2018 | Wang ................. G06F 17/2217 |
| 2008/0180735 | A1 * | 7/2008 | Park ..................... G06F 21/608 358/1.15 |

(Continued)

FOREIGN PATENT DOCUMENTS

CN    102479075 A    5/2012

OTHER PUBLICATIONS

Jalan et al., "New Encoding Schemes for Efficient Multilingual Text Messaging," 2014 Twentieth National Conference on Communications (NCC), http://ieeexplore.ieee.org/search/searchresult.jsp?newsearch=true&queryText=.QT.New%20Encoding%20Schemes%20for%20Efficient%20Multilingual%20Text%20Messaging,.QT., pp. 1-6, Feb. 2014.

(Continued)

*Primary Examiner* — Lam T Mai
(74) *Attorney, Agent, or Firm* — Robert J. Shatto

(57) ABSTRACT

Disclosed aspects relate to encoded text data management using a set of encoded text data types. A first set of bits which indicates a first encoded text data type may be identified. A second set of bits which indicates a first quantitative size of a third set of bits for a first set of text data of the first encoded text data type may be identified. Using both the first set of bits and the second set of bits, an encoded data management operation may be executed with respect to the third set of bits for the first set of text data of the first encoded text data type.

20 Claims, 7 Drawing Sheets

(56) References Cited

U.S. PATENT DOCUMENTS

2012/0095748 A1    4/2012  Li et al.
2012/0254181 A1  10/2012  Schofield et al.
2016/0275072 A1*  9/2016  Ideuchi .............. G06F 17/2217

OTHER PUBLICATIONS

Zavarsky et al., "Language and encoding scheme identification of extremely large sets of multilingual text documents," http://www.mt-archive.info/MTS-2005-Zavarsky.pdf, pp. 354-355, Department of Management and Information Sciences, Nagaoka University of Technology, 1603-1, Kamitomioka, 940-2188 Nagaoka, Japan.
Wang, et al., "Encoded Text Data Management," U.S. Appl. No. 15/584,277, filed May 2, 2017.
List of IBM Patents or Patent Applications Treated as Related, Apr. 11, 2018, 2 pgs.

* cited by examiner

400

| UTF-8 encoding Bytes to encode characters | | Most Popular encoding methods of some languages | |
|---|---|---|---|
| US-ASCII encoding | 1 Byte | Traditional Chinese (Big 5) | 2 Bytes |
| Most European languages, ex: Latin, Greek, Cyrillic, Hebrew, Arabic... | 2 Bytes | Simplified Chinese (GB18030) | 2 Bytes |
| Chinese, Japanese, Korean | 3 Bytes | Japanese (Shift_JIS) | 1~2 Bytes |
| Others | 4 Bytes | Korean (EUC-KR) | 2 Bytes |

01001000 00010011 01010100 01101000 01101001 01110011 00100000 .... 00100000
                                T        h        i        s    [space]    [space]
  indicator for        continuous word count: 10
  continuous word
  count bits
  encoding method: Ascii 00000010 10100100 10100100 10100100 11100101 ......
                     中                    文
         continuous word count: 2
  encoding method: Big5

UTF-8

01010100 01101000 01101001 01110011 00100000... 00100000
    T        h        i        s    [space]    [space]
11100100 10111000 00000000  11100110 10010110 00000000 .....
             中                          文

| Language | Traditional Chinese | Simplified Chinese | Japanese | Korean | English | ... |
|---|---|---|---|---|---|---|
| Encoding | Big5 | GB18030 | Shift_JIS | EUC-KR | UTF-8 | ... |
| Bitmap | 0000 | 0001 | 0010 | 0011 | 0100 | ... |

01001000 00010011 01010100 01101000 01101001 01110011 00100000 .... 00100000
         |        T        h        i        s        [space]    [space]
|        └▶ continuous word count: 10
|
└▶ indicator for
   continuous word
   count bits
└▶ encoding method: Ascii 00000010 10100100 10100100 10100100 11100101 ......
         |        中                 文
         └▶ continuous word count: 2
└▶ encoding method: Big5

FIG. 7

ENCODED TEXT DATA MANAGEMENT

BACKGROUND

This disclosure relates generally to computer systems and, more particularly, relates to encoded text data management using a set of encoded text data types.

The number of text data being processed is increasing. As the amount of text data being processed increases, the need for encoded text data management using a set of encoded text data types may also increase.

SUMMARY

Aspects of the disclosure relate to displaying languages on computing devices. Various character encoding methodologies may be utilized to display multiple different language. The various character encoding methodologies utilize varying amounts of storage space. Disclosed aspects include an encoding methodology which can utilize predefined prefixes and a mapping table. The encoding methodology may be encoded from and decoded to with application embedded encoding. Features can calculate a continuous word count a set of data such as a language of text to compute a number of word count bits for utilization. Aspects may efficiently use storage space when a page of text content has many different encodings. A utilized number of encoding spaces may be managed to be held below a threshold number of encoding spaces.

Disclosed aspects relate to encoded text data management using a set of encoded text data types. A first set of bits which indicates a first encoded text data type may be identified. A second set of bits which indicates a first quantitative size of a third set of bits for a first set of text data of the first encoded text data type may be identified. Using both the first set of bits and the second set of bits, an encoded data management operation may be executed with respect to the third set of bits for the first set of text data of the first encoded text data type. In embodiments, a fourth set of bits which indicates a second encoded text data type can be identified. In such embodiments, a fifth set of bits which indicates a second quantitative size of a sixth set of bits for a second set of text data of the second encoded text data type can be identified. In such embodiments, using both the fourth set of bits and the fifth set of bits, the encoded data management operation can be executed with respect to the sixth set of bits for the second set of text data of the second encoded text data type.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 4 illustrates an example of encoded text data management using a set of encoded text data types, according to embodiments.

FIG. 5 illustrates an example of encoded text data management using a set of encoded text data types, according to embodiments.

FIG. 6 illustrates an example of encoded text data management using a set of encoded text data types, according to embodiments.

FIG. 7 illustrates an example of encoded text data management using a set of encoded text data types, according to embodiments.

Figure 1:
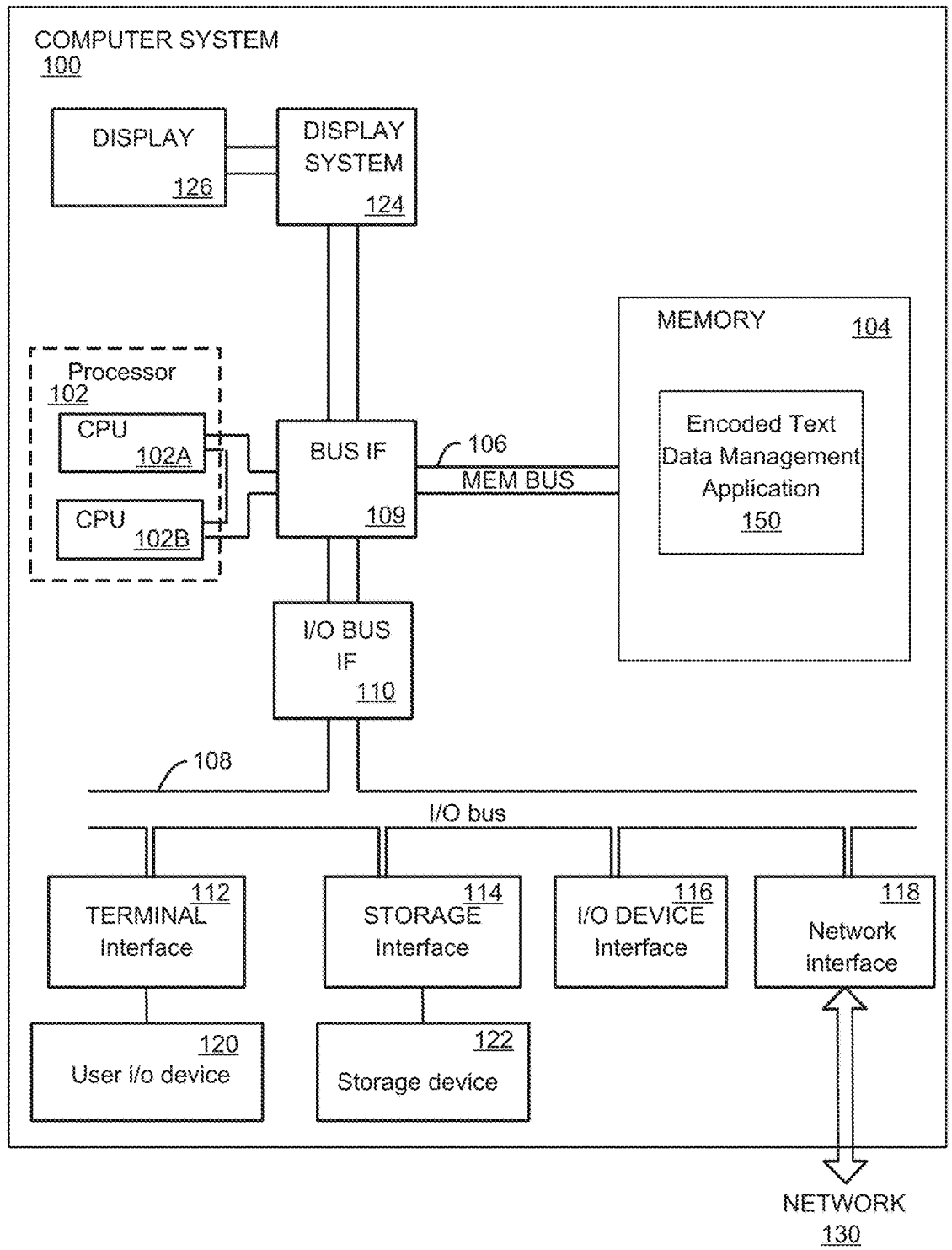
FIG. 1 depicts a high-level block diagram of a computer system for implementing various embodiments of the present disclosure, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the disclosure relate to displaying languages on computing devices. Various character encoding methodologies may be utilized to display multiple different language. The various character encoding methodologies utilize varying amounts of storage space. Disclosed aspects include an encoding methodology which can utilize predefined prefixes and a mapping table. The encoding methodology may be encoded from and decoded to with application embedded encoding. Features can calculate a continuous word count for a set of data, such as a language of text, to compute a number of word count bits for utilization. Aspects may efficiently use storage space when a page of text content has many different encodings. A utilized number of encoding spaces may be managed to be held below a threshold number of encoding spaces.

Aspects of the disclosure relate to a system, method, and computer program product for encoded text data management using a set of encoded text data types. A first set of bits which indicates a first encoded text data type may be identified. A second set of bits which indicates a first quantitative size of a third set of bits for a first set of text data of the first encoded text data type may be identified. Using both the first set of bits and the second set of bits, an encoded data management operation may be executed with respect to the third set of bits for the first set of text data of the first encoded text data type.

In embodiments, a fourth set of bits which indicates a second encoded text data type can be identified. A fifth set of bits which indicates a second quantitative size of a sixth set of bits for a second set of text data of the second encoded text data type can be identified. Using both the fourth set of bits and the fifth set of bits, the encoded data management operation can be executed with respect to the sixth set of bits for the second set of text data of the second encoded text data type.

For example, consider a first illustrative phrase which may appear in a browser that supports a plurality of text encoding methodologies: "在如微軟及 IBM 等企業中,則會使用全球化 (英文 globalization) 來表示此兩者的合稱。

在英文中, 也會使用 g11n 做為簡稱 ". The first illustrative phrase includes twenty English letters, thirty-nine Chinese characters, and seven full-width punctuation marks. Using a UTF-8 character encoding methodology for the first illustrative phrase would utilize 158 bytes (calculated by: 20*1+ 39*3+7*3). Using a UTF-16 character encoding methodology for the first illustrative phrase would utilize 132 bytes (calculated by: 20*2+39*2+7*2). Using a disclosed character encoding technique, as described herein, for the first illustrative phrase would utilize 122 bytes (calculated by: 1+5*2+1+3*1+2+16*2+2+13*1+2+20*2+1+4*1+1+5*2). As such, storage space may be saved by the disclosed character encoding technique. In the above example, approximately twenty-two percent less data is required to store the encoded illustrative phrase when compared to the UTF-8 character encoding methodology, and approximately eight percent less when compared to the UTF-16 character encoding methodology. When used at scale, the storage savings may be significant.

Accordingly, in various embodiments, a single set of text data may be configured to include both the first and second sets of text data of the first and second encoded text data types. The encoded data management operation may be executed using the first, second, fourth, and fifth sets of bits. The executing may be performed with respect to the third and sixth sets of bits for the single set of text data having both the first and second encoded text data types.

In certain embodiments, the encoded data management operation may be configured for a first language. The configuring may be performed to execute the encoded data management operation with respect to the third set of bits for the first set of text data of the first encoded text data type using the first set of bits. The encoded data management operation may be configured for a second language to execute the encoded data management operation with respect to the sixth set of bits for the second set of text data of the second encoded text data type using the fourth set of bits.

In embodiments, a first byte may be structured to include the first set of bits. The first byte may be structured to include at least a portion of the second set of bits. The first byte may be structured to include at least a portion of the third set of bits. In embodiments, a second byte may be structured to include at least a portion of the second set of bits. The second byte may be structured to include at least a portion of the third set of bits. Altogether, aspects of the disclosure can have performance or efficiency benefits. Aspects may save resources such as bandwidth, disk, processing, or memory.

Turning now to the figures, FIG. 1 depicts a high-level block diagram of a computer system for implementing various embodiments of the present disclosure, according to embodiments. The mechanisms and apparatus of the various embodiments disclosed herein apply equally to any appropriate computing system. The major components of the computer system 100 include one or more processors 102, a memory 104, a terminal interface 112, a storage interface 114, an I/O (Input/Output) device interface 116, and a network interface 118, all of which are communicatively coupled, directly or indirectly, for inter-component communication via a memory bus 106, an I/O bus 108, bus interface unit 109, and an I/O bus interface unit 110.

The computer system 100 may contain one or more general-purpose programmable central processing units (CPUs) 102A and 102B, herein generically referred to as the processor 102. In embodiments, the computer system 100 may contain multiple processors; however, in certain embodiments, the computer system 100 may alternatively be a single CPU system. Each processor 102 executes instructions stored in the memory 104 and may include one or more levels of on-board cache.

In embodiments, the memory 104 may include a random-access semiconductor memory, storage device, or storage medium (either volatile or non-volatile) for storing or encoding data and programs. In certain embodiments, the memory 104 represents the entire virtual memory of the computer system 100, and may also include the virtual memory of other computer systems coupled to the computer system 100 or connected via a network. The memory 104 can be conceptually viewed as a single monolithic entity, but in other embodiments the memory 104 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The memory 104 may store all or a portion of the various programs, modules, and data structures for processing data transfers as discussed herein. For instance, the memory 104 can store an encoded text data management application 150. In embodiments, the encoded text data management application 150 may include instructions or statements that execute on the processor 102 or instructions or statements that are interpreted by instructions or statements that execute on the processor 102 to carry out the functions as further described below. In certain embodiments, the encoded text data management application 150 is implemented in hardware via semiconductor devices, chips, logical gates, circuits, circuit cards, and/or other physical hardware devices in lieu of, or in addition to, a processor-based system. In embodiments, the encoded text data management application 150 may include data in addition to instructions or statements.

The computer system 100 may include a bus interface unit 109 to handle communications among the processor 102, the memory 104, a display system 124, and the I/O bus interface unit 110. The I/O bus interface unit 110 may be coupled with the I/O bus 108 for transferring data to and from the various I/O units. The I/O bus interface unit 110 communicates with multiple I/O interface units 112, 114, 116, and 118, which are also known as I/O processors (IOPs) or I/O adapters (IOAs), through the I/O bus 108. The display system 124 may include a display controller, a display memory, or both. The display controller may provide video, audio, or both types of data to a display device 126. The display memory may be a dedicated memory for buffering video data. The display system 124 may be coupled with a display device 126, such as a standalone display screen, computer monitor, television, or a tablet or handheld device display. In one embodiment, the display device 126 may include one or more speakers for rendering audio. Alternatively, one or more speakers for rendering audio may be coupled with an I/O interface unit. In alternate embodiments, one or more of the functions provided by the display system 124 may be on board an integrated circuit that also includes the processor 102. In addition, one or more of the functions provided by the bus interface unit 109 may be on board an integrated circuit that also includes the processor 102.

The I/O interface units support communication with a variety of storage and I/O devices. For example, the terminal interface unit 112 supports the attachment of one or more user I/O devices 120, which may include user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 120 and the computer system 100, and may receive output data via the user output devices. For example, a user interface may be presented via the user I/O device 120, such as displayed on a display device, played via a speaker, or printed via a printer.

The storage interface 114 supports the attachment of one or more disk drives or direct access storage devices 122 (which are typically rotating magnetic disk drive storage devices, although they could alternatively be other storage devices, including arrays of disk drives configured to appear as a single large storage device to a host computer, or solid-state drives, such as flash memory). In some embodiments, the storage device 122 may be implemented via any type of secondary storage device. The contents of the memory 104, or any portion thereof, may be stored to and retrieved from the storage device 122 as needed. The I/O device interface 116 provides an interface to any of various other I/O devices or devices of other types, such as printers or fax machines. The network interface 118 provides one or more communication paths from the computer system 100 to other digital devices and computer systems; these communication paths may include, e.g., one or more networks 130.

Although the computer system 100 shown in FIG. 1 illustrates a particular bus structure providing a direct communication path among the processors 102, the memory 104, the bus interface 109, the display system 124, and the I/O bus interface unit 110, in alternative embodiments the computer system 100 may include different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface unit 110 and the I/O bus 108 are shown as single respective units, the computer system 100 may, in fact, contain multiple I/O bus interface units 110 and/or multiple I/O buses 108. While multiple I/O interface units are shown, which separate the I/O bus 108 from various communications paths running to the various I/O devices, in other embodiments, some or all of the I/O devices are connected directly to one or more system I/O buses.

In various embodiments, the computer system 100 is a multi-user mainframe computer system, a single-user system, or a server computer or similar device that has little or no direct user interface, but receives requests from other computer systems (clients). In other embodiments, the computer system 100 may be implemented as a desktop computer, portable computer, laptop or notebook computer, tablet computer, pocket computer, telephone, smart phone, or any other suitable type of electronic device.

Figure 2:
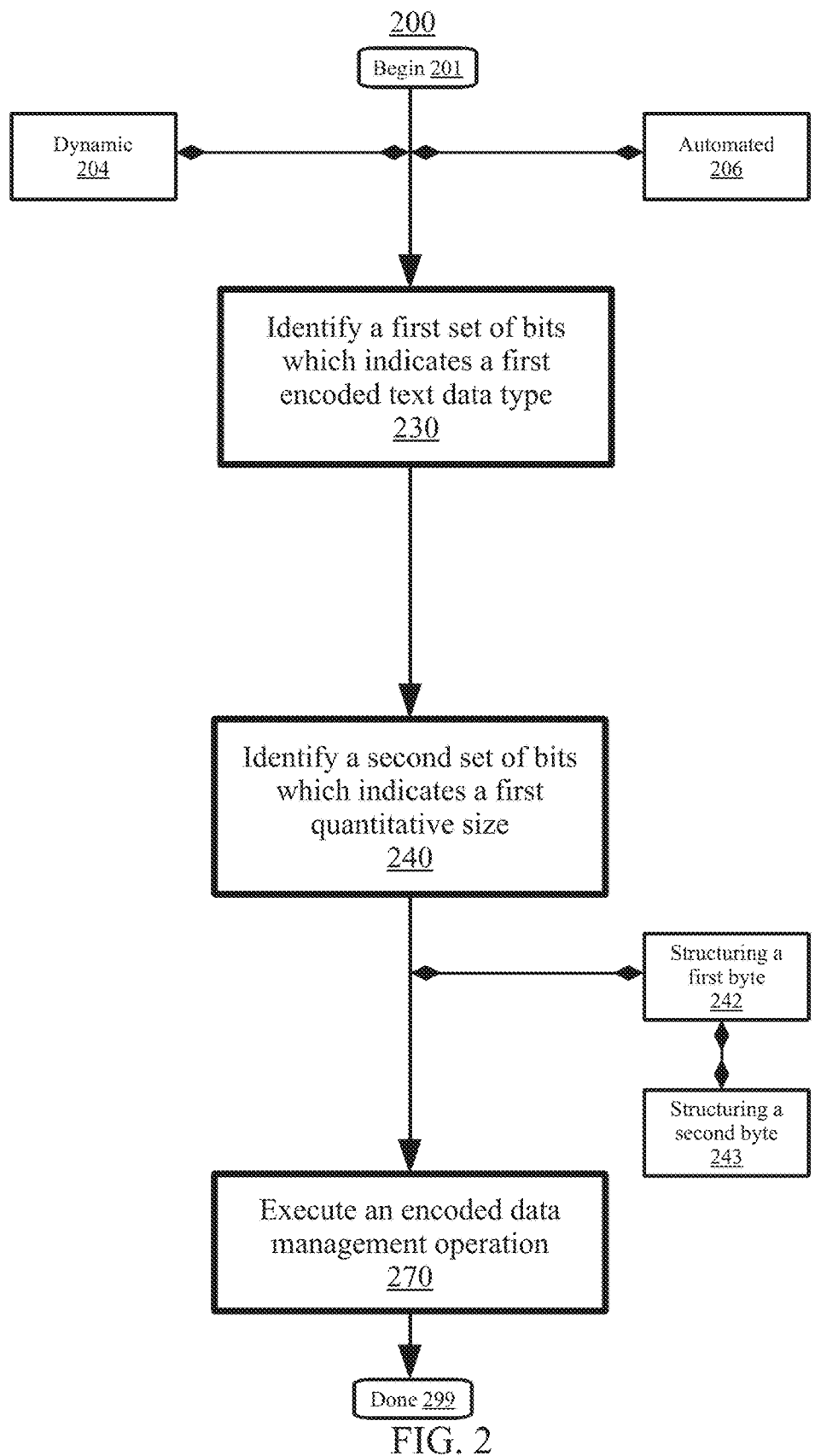
FIG. 2 is a flowchart illustrating an example method of encoded text data management using a set of encoded text data types, according to embodiments.

FIG. 2 is a flowchart illustrating a method 200 of encoded text data management using a set of encoded text data types, according to embodiments. The encoded text data management may be utilized to display languages in text on computing devices. The encoding methodology can utilize predefined prefixes and a mapping table. As such, the encoding methodology may be encoded from and decoded to with application embedded encoding. Features can calculate a continuous word count a set of data such as a language of text to compute a number of word count bits for utilization. Aspects may efficiently use storage space when a page of text content has many different encodings. A utilized number of encoding spaces may be managed to be held below a threshold number of encoding spaces. The method 200 may begin at block 201.

In embodiments, the identifying the first set of bits, the identifying the second set of bits, the identifying the fourth set of bits, the identifying the fifth set of bits, the executing of the encoded data management operation (e.g., encoding, decoding), and the other steps described herein may each be executed, performed, or carried-out in a dynamic fashion (e.g., continuous, ongoing, on-the-fly, without stopping) at block 204. The steps described herein may be executed in a dynamic fashion to streamline encoded text data management using the set of encoded text data types.

In embodiments, the identifying the first set of bits, the identifying the second set of bits, the identifying the fourth set of bits, the identifying the fifth set of bits, the executing of the encoded data management operation, and the other steps described herein may each be executed in an automated fashion at block 206. The steps described herein may be executed in an automated fashion without user intervention or manual action (e.g., using automated computer machinery, fully machine-driven without manual stimuli). The automated operational steps may be performed by an encoded text data management engine (e.g., as part of a browser, application, or display apparatus), or the like.

At block 230, a first set of bits which indicates a first encoded text data type may be identified. In embodiments, a fourth set of bits which indicates a second encoded text data type can be identified. Generally, identifying can include detecting, recognizing, sensing, discovering, resolving, ascertaining, or otherwise determining the first set of bits or the fourth set of bits. The first set of bits can include one or more bits of a first given byte. In embodiments, the first set of bits includes the initial/first four bits of the first given byte. The fourth set of bits may be similar to the first set of bits, in that, in embodiments, the fourth set of bits includes the initial/first four bits of a second given byte. Intervening bytes may be present between the first given byte and the second given byte. Embodiments may vary as to whether it is the initial four bits or last four bits, or the initial three bits or initial five bits, etc. As described herein, for illustrative purposes, the initial four bits are generally utilized (though the disclosure is not limited as such unless expressly stated otherwise). Other possibilities, consistent with those explicitly/implicitly described herein, are considered with respect to the first/second encoded text data types.

The first encoded data text type may include an encoding method such as ASCII, Big5, UTF-8, UTF-16, EUC-KR, Shift_JS, GB18030, or the like. Similarly, the second encoded text data type may include an encoding method, which is different from the first encoded text data type, such as ASCII, Big5, UTF-8, UTF-16, EUC-KR, Shift_JS, GB18030, or the like. As such, n encoded text data types may be used one or more times for a given set of text data. Altogether, in embodiments, the first/fourth set of bits (e.g., first four bits, prefix) can be used to indicate/represent/identify the text encoding method/technique used. Other possibilities, consistent with those explicitly/implicitly described herein, are considered with respect to the first/second encoded text data types.

At block 240, a second set of bits may be identified. The second set of bits may indicate a first quantitative size of a third set of bits for a first set of text data (e.g., a first group of actual text-values to be encoded/decoded) of the first encoded text data type. In embodiments, a fifth set of bits may be identified. The fifth set of bits may indicate a second quantitative size of a sixth set of bits for a second set of text data (e.g., a second group of actual text-values to be encoded/decoded) of the second encoded text data type. Generally, identifying can include detecting, recognizing, sensing, discovering, resolving, ascertaining, or otherwise determining the second set of bits or the fifth set of bits. In embodiments, the second set of bits may include the fifth bit of the first given byte (and initial/first bit of other bytes that do not signify an encoding method). Similarly, the fifth set of bits may include the fifth bit of the second given byte.

In general, the second/fifth set of bits may be a single bit (e.g., having a 0 or 1 bit-value for the fifth bit of a given byte) or a plurality of bits (e.g., the fifth bit of a specific byte and the first bit of subsequent bytes to the specific byte). The bit-value of the second/fifth set of bits provides an indication of a quantitative size or length of continuous word count bits for text data (e.g., how many bits describe the character/symbol). The first set of text data is generally included in at least the sixth through eighth bits of the first given byte, and second through eighth bits of successive bytes as appropriate. For instance, a 1 bit-value in the fifth bit of the specific byte may indicate that the text-value carries-over into the next byte. As such, the first bit of the next byte is analyzed. When the bit-value of the first bit of the next byte is 1, then the text-value carries-over into another byte; however, when the bit-value of the first bit of the next byte is 0, then the text-value ends does not carry-over into the another byte. The process can continue for n bytes.

In embodiments, a first byte may be structured to include the first set of bits at block 242. Generally, structuring can include establishing, creating, generating, compiling, structuring, constructing, assembling, forming, organizing, configuring, introducing, or the like. As such, the first byte can include an encoding method indicator (e.g., the first four bits of the first byte are 0100 which indicates the encoding method is ASCII, the first four bits of the first byte are 0000 which indicates the encoding method is Big5). The first byte may be structured to include at least a portion of the second set of bits. As such, the first byte can include an indicator for continuous word count bits (e.g., the fifth bit of the first byte has a bit-value of 1 which indicate the text-value continues to the next byte, the fifth bit of the first byte has a bit-value of 0 which indicate the text-value does not continue to the next byte). The first byte may be structured to include at least a portion of the third set of bits. As such, the first byte can include a text-value portion (e.g., the sixth, seventh, and eighth bits of the first byte which indicate at least a portion of the text-value). Multiple first bytes may be included with various second bytes interspersed between the individual first bytes.

In embodiments, a second byte may be structured to include at least a portion of the second set of bits at block 243. For example, the first bit of the second byte may indicate whether the text-data continues to a next byte or whether the next byte has a prefix which indicates an encoding method. As such, the second byte can play a role in indicating a length of a continuous word count. The second byte may be structured to include at least a portion of the third set of bits. In embodiments, the third set of bits may include the second, third, fourth, fifth, sixth, seventh, and eighth bits of the second byte. Generally, structuring can include establishing, creating, generating, compiling, structuring, constructing, assembling, forming, organizing, configuring, introducing, or the like.

At block 280, an encoded data management operation may be executed. Execution of the encoded data management operation may be performed with respect to the third set of bits for the first set of text data of the first encoded text data type. Execution of the encoded data management operation may be performed using both the first set of bits and the second set of bits. In embodiments, execution of the encoded data management operation may be performed with respect to the sixth set of bits for the second set of text data of the second encoded text data type. In such embodiments, execution of the encoded data management operation may be performed using both the fourth set of bits and the fifth set of bits. Generally, executing can include processing, performing, carrying-out, initiating, launching, instantiating, implementing, enacting, or running a job, task, computer operation, computer action, or the like. The encoded data management operation may include encoding text-data into bytes/bits. The encoded data management operation may include decoding bytes/bits into text-data. The encoded data management operation can utilize a technique, methodology, or algorithm based on a prefix and original text. The first set of bits may include the prefix. The third set of bits may include the original text. The encoding/decoding may occur in an application program having encoding/decoding operations embedded/built-in. Various possibilities are considered for the encoded data management operation consistent with aspects described herein related to encoding and decoding.

For example, consider a second illustrative phrase which may appear in a browser that supports a plurality of text encoding methodologies: "國際化與本地化英文 internationalization and localization". The second illustrative phrase include thirty-five English letters, nine Chinese characters, three full-width punctuation marks, and two spaces. Using a UTF-8 character encoding methodology for the second illustrative phrase would utilize 73 bytes (calculated by: 35*1+9*3+3*3+2*1). Using a UTF-16 character encoding methodology for the second illustrative phrase would utilize 98 bytes (calculated by: 35*2+9*2+3*2+2*2). Using a disclosed character encoding technique, as described herein, for the second illustrative phrase would utilize 64 bytes (calculated by: 2+11*2+2+35*1+1+1*2). As such, storage space may be saved by the disclosed character encoding technique such as approximately twelve percent less when compared to the UTF-8 character encoding methodology and approximately thirty-five percent less when compared to the UTF-16 character encoding methodology. When used at scale, the storage savings may be significant. To further show how the disclosed character encoding technique may appear, consider the next two paragraphs which correspond to the second illustrative phrase. For conciseness, the binary and human readable text for a portion of the second illustrative phrase is shown. Specifically, the binary and human readable text for the first two Chinese characters (國 and 際 the last two Chinese characters (英 and 文 ), the colon, and the first two letters ("i" and "n") and the last two letters ("o" and "n") of the word "internationalization" are shown. Additionally, the binary and corresponding human readable text notation for the type of encoding (e.g., Big5 and Ascii) and number of words encoded is shown. Omitted portions of the binary and human readable text are indicated by ellipses.

00001000 00001011 10110000 11101010 10111011 11011010 . . . 10101101 01011110 10100100 11100101

10100001 01000111 01001000 00100011 01101001 01101110 . . . 01101111 01101110 00000001 10100001 01011110.

Big5 11 words 國 際 . . . 英 文 : Ascii 35 words i n . . . o n Big5 1 word.

Method 200 concludes at block 299. Aspects of method 200 may provide performance or efficiency benefits for encoded text data management. Aspects may save resources such as bandwidth, disk, processing, or memory (e.g., storing less data, transferring less data).

Figure 3:
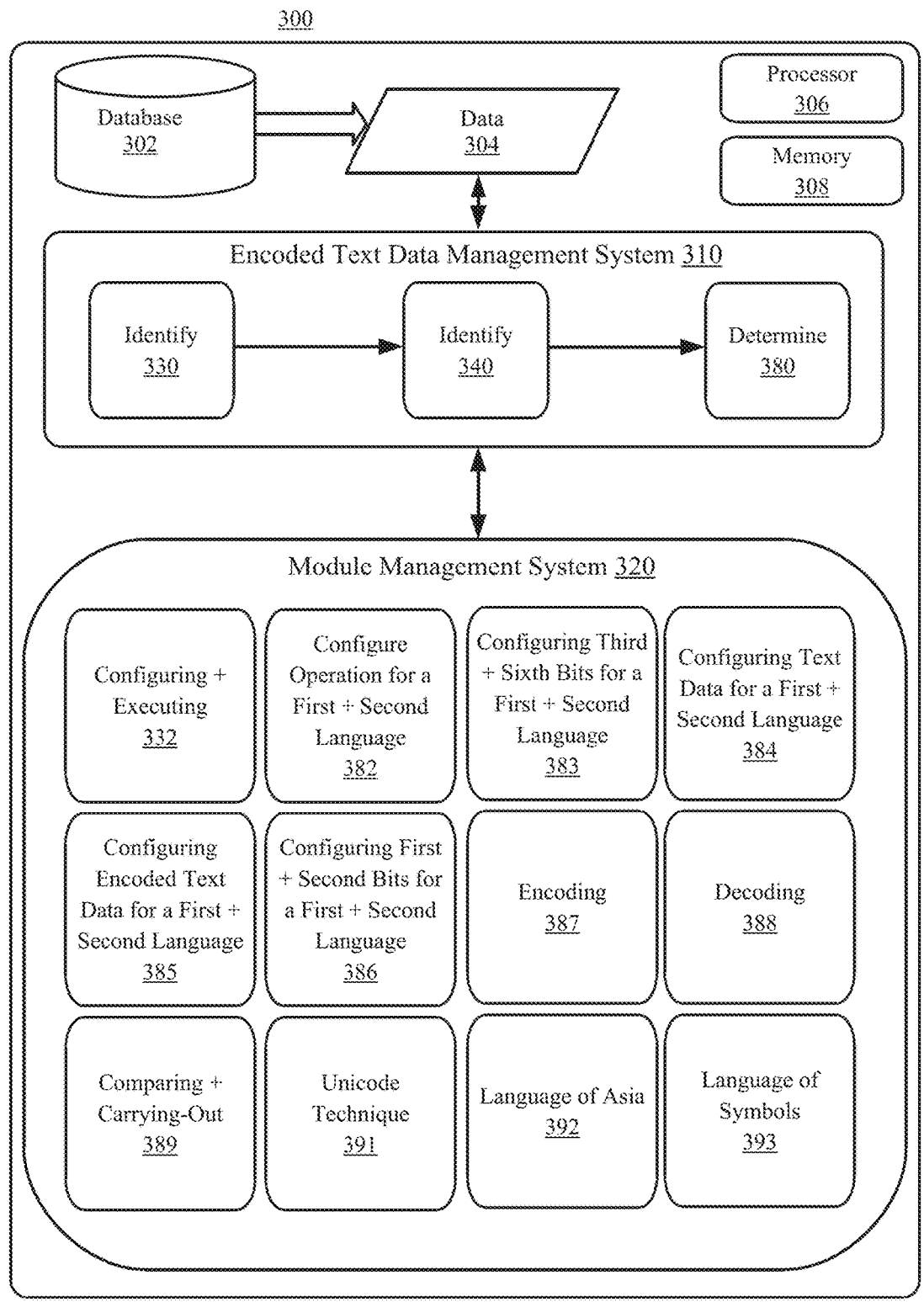
FIG. 3 is an example system of encoded text data management using a set of encoded text data types, according to embodiments.

FIG. 3 is an example system 300 of encoded text data management using a set of encoded text data types, according to embodiments. The example system 300 may include a processor 306 and a memory 308 to facilitate implementation of encoded text data management. The example system 300 may include a database 302 (e.g., encoded text database). In embodiments, the example system 300 may include an encoded text data management system 310. The encoded text data management system may be communicatively connected to the database 302, and be configured to receive data 304 related to encoded text. The encoded text data management system may include a first identifying module 330 to identify a first set of bits which indicates a first encoded text data type and identify a fourth set of bits which indicates a second encoded text data type, a second identifying module 340 to identify a second set of bits which indicates a first quantitative size of a third set of bits for a first set of text data of the first encoded text data type and identify a fifth set of bits which indicates a second quantitative size of a sixth set of bits for a second set of text data of the second encoded text data type, and an executing module 380 to execute an encoded data management operation with respect to the third set of bits for the first set of text data of the first encoded text data type and execute the encoded data management operation with respect to the sixth set of bits for the second set of text data of the second encoded text data type. The encoded text data management system 310 may be communicatively connected with a module management system 320 that includes one or more modules for implementing aspects of encoded text data management using a set of encoded text data types.

In embodiments, a single set of text data may be configured to include both the first and second sets of text data of the first and second encoded text data types at module 332. Generally, configuring can include formulating, arranging, programming, setting-up, establishing organizing, or otherwise constructing. The encoded data management operation may be executed using the first, second, fourth, and fifth sets of bits. The executing may be performed with respect to the third and sixth sets of bits for the single set of text data having both the first and second encoded text data types. For example, the first set of text data may include a first character/symbol/emoji and a second set of text data may include a second character/symbol/emoji. When merged together as a single set of text data, a word, phrase, or conjunction of characters having a meaning may be assembled/formed. As such, the various bits of one or more bytes may be translated/decoded into a phrase, set of symbols, or the like. Similarly, a phrase or set of symbols may be translated/encoded into the various bits of one or more bytes.

In embodiments, the encoded data management operation may be configured for a first language at module 382. The configuring may be performed to execute/carry-out the encoded data management operation with respect to the third set of bits for the first set of text data of the first encoded text data type using the first set of bits. The encoded data management operation may be configured for a second language to execute/carry-out the encoded data management operation with respect to the sixth set of bits for the second set of text data of the second encoded text data type using the fourth set of bits. Generally, configuring can include formulating, arranging, programming, setting-up, establishing organizing, or otherwise constructing.

As such, the encoded data management operation may be carried-out with respect to both the first and second languages and their corresponding bits/bytes, text data, and encoded text data type. For instance, the first set of text data may be in Korean, use a EUC-KR encoded text data type (e.g., as indicated by the first set of bits), and the Korean text may be associated with the third set of bits. The second set of text data may be in Chinese, use a Big5 encoded text data type (e.g., as indicated by the fourth set of bits), and the Chinese text may be associated with the sixth set of bits. Altogether, multiple languages (e.g., n languages) can be encoded/decoded at once (e.g., simultaneously, concurrently) in an efficient manner using the disclosed technique described herein.

In embodiments, the third set of bits may be configured to indicate a first language at module 383. The sixth set of bits may be configured to indicate a second language. Generally, configuring can include formulating, arranging, programming, setting-up, establishing organizing, or otherwise constructing. For instance, the third set of bits may indicate/symbolize/represent English characters/text and the sixth set of bits may indicate/symbolize/represent Japanese characters/text. Altogether, multiple languages (e.g., n languages) can be represented, encoded, or decoded using the disclosed technique described herein.

In embodiments, the first set of text data may be configured to indicate/symbolize/represent a first language at module 384. The second set of text data may be configured to indicate/symbolize/represent a second language. Generally, configuring can include formulating, arranging, programming, setting-up, establishing organizing, or otherwise constructing. For instance, the first set of text data may correspond to Traditional Chinese and the second set of text data may correspond to Simplified Chinese. Altogether, multiple languages (e.g., n languages) can be represented, encoded, or decoded using the disclosed technique described herein.

In embodiments, the first encoded text data type may be configured to indicate a first language at module 385. The second encoded text data type may be configured to indicate a second language. Generally, configuring can include formulating, arranging, programming, setting-up, establishing organizing, or otherwise constructing. For instance, the first encoded text data type may indicate/symbolize/represent Big5 encoding of Traditional Chinese and the second encoded text data type may indicate/symbolize/represent Shift_JS encoding of Japanese. Altogether, multiple languages (e.g., n languages) can be represented, encoded, or decoded using the disclosed technique described herein.

In embodiments, the first set of bits may be configured to indicate a first language at module 386. The second set of bits may be configured to indicate a second language. Generally, configuring can include formulating, arranging, programming, setting-up, establishing organizing, or otherwise constructing. For instance, the first set of bits may indicate/symbolize/represent an encoding in Korean and the second set of bits may indicate/symbolize/represent an encoding in English. Altogether, multiple languages (e.g., n languages) can be represented, encoded, or decoded using the disclosed technique described herein.

In embodiments, the encoded data management operation may be structured at module 387. The encoded data management operation may be structured to include encoding the first set of text data using the first, second, and third sets of bits, and encoding the second set of text data using the fourth, fifth, and sixth sets of bits. Generally, the structuring of module 387 can include establishing, creating, generating, compiling, structuring, constructing, assembling, forming, organizing, configuring, introducing, or otherwise building an encoding operation. The encoding operation can include a process of putting/converting/translating a set/sequence of characters (e.g., letters, numbers, punctuation, certain symbols, emojis) into a specialized format for efficient transmission or storage.

In embodiments, the encoded data management operation may be structured at module 388. The encoded data management operation may be structured to include decoding the first, second, and third sets of bits to access the first set of text data and decoding the fourth, fifth, and sixth sets of bits to access the second set of text data. Generally, the structuring of module 388 can include establishing, creating, generating, compiling, structuring, constructing, assembling, forming, organizing, configuring, introducing, or otherwise building a decoding operation. The decoding operation can include a process of taking a specialized format used for efficient transmission or storage of data and converting/translating it into a set/sequence of characters (e.g., letters, numbers, punctuation, certain symbols, emojis) which may be read, presented, provided, or displayed (e.g., the conversion of an encoded format back into an original set/sequence of characters).

In embodiments, the encoded data management operation may be structured at module 389. The encoded data management operation may be structured to include a plurality of comparing operations and a plurality of carrying-out operations. The first set of bits may be compared with a mapping data structure to ascertain a first encoded text data type match. Based on the first encoded text data type match, a first application embedded encoding technique may be carried-out. The fourth set of bits may be compared with the mapping data structure (e.g., the same data structure) to ascertain a second encoded text data type match. Based on the second encoded text data type match, a second application embedded encoding technique may be carried-out.

Generally, comparing can include contrasting, analyzing, juxtaposing, correlating, or evaluating the one or more bits with one or more entries of the mapping data structure (e.g., table, index). The comparing (or other operational steps described herein including the carrying-out) may be performed using an encoded text data management engine (e.g., as part of a browser, application, or display apparatus). For instance, the encoded text data management engine may compare the bit-values of 0000 (e.g., the first set of bits) with the mapping data structure to ascertain (e.g., resolve, determine) that 0000 maps to (e.g., matches with) a Big5 encoded text data type. The encoded text data management engine may compare the bit-values of 0011 (e.g., the fourth set of bits) with the mapping data structure to ascertain (e.g., resolve, determine) that 0011 maps to (e.g., matches with) a EUC-KR encoded text data type. Based on the ascertained encoded text data-types, an appropriate application embedded encoding technique may be performed in a software application such as a browser, or the like. As such, in various embodiments, existing encoding techniques may be utilized to form or assemble aspects described herein. Such existing encoding techniques may be supplemented with the disclosed functionality and, in certain embodiments, use the encoded text data management engine to perform encoding or decoding. Other possibilities consistent with aspects described herein are also considered.

In embodiments, the encoded data management operation may be configured at module 391. The encoded data management operation may be configured to utilize fewer bytes in comparison with a Unicode technique. UTF-8 (Unicode) requires much more storage spaces than other encodings for languages such as for Chinese. For instance, UTF-8 may need three bytes to encode a character whereas Big5 (Traditional Chinese) or GB18030 (Simplified Chinese) may only take only two bytes to store or display. As such, using multiple encoded text data types via one or more of the disclosed techniques described herein can have performance or efficiency benefits relative to UTF-8 or the like. A set of counts of the number of bytes used by various encoding methodologies for a same baseline phrase, sentence, paragraph, or block of characters, text, symbols, or the like may be computed. Respective counts of the set of counts may be compared or otherwise evaluated (e.g., computing one or more ratios). As described in various examples herein, a single language (such as UTF-8) may utilize more space than the disclosed technique.

In embodiments, the first language may be configured to include a language of Asia at module 392. Aspects of the disclosure may be useful for languages of Asia (e.g., Japanese, Chinese, Korean) due to various relative complexities of characters. In addition, the various languages of Asia can have a number of variants. At times, multiple variants of similar languages may be melded-together in data. Processing such melded-together data may be challenging. However, aspects of the encoded data management, particularly for Asian languages, may have performance or efficiency benefits (e.g., bandwidth, disk, processing, memory).

In embodiments, the first language may be configured to include a language of symbols at module 393. An ideogram (e.g., a graphic symbol that represents an idea or concept, independent of any particular language, and specific words or phrases), a pictogram/pictograph (e.g., an ideogram that conveys its meaning through its pictorial resemblance to a physical object such as when used in writing and graphic systems in which the characters are to a considerable extent pictorial in appearance), a logogram/logograph (e.g., a written character that represents a word or phrase), a hieroglyph (e.g., an artistic representation of an esoteric idea), or the like may be include. Emoji, for example, are one tool that can be used to convey thoughts, ideas, concepts, and representations of objects between users in digital communication environments. An emoji can include a complete or thorough meaning and thought behind an image or picture. As such, aspects described herein can have a positive impact on cross-language/symbol communications. Other possibilities consistent with aspects explicitly/implicitly described herein are also considered.

FIG. 4 illustrates an example 400 of encoded text data management using a set of encoded text data types, according to embodiments. The example 400 provides an illustration of storage space considerations when performing an encoding/decoding operation. For instance, for certain languages (e.g., languages of Asia), methodologies such as UTF-8 may require more space than others to encode a character. Accordingly, aspects of the disclosure relate to such challenges.

FIG. 5 illustrates an example 500 of encoded text data management using a set of encoded text data types, according to embodiments. The example 500 compares aspects described herein with UTF-8. As such, the illustration provides a concrete depiction of how the described technique may be utilized and compares/evaluates the same text data across different methodologies.

FIG. 6 illustrates an example 600 of encoded text data management using a set of encoded text data types, according to embodiments. The example 600 illustrates an example mapping data structure for utilization to compare/evaluate the first/fourth set of bits. The example 600 includes various languages (e.g., Traditional Chinese, Simplified Chinese, Japanese, Korean, English), various encoded text data types (Big5, GB18030, Shift_JS, EUC-KR, UTF-8), and various sets of bit-values (0000, 0001, 0010, 0011, 0100). Other possibilities are considered, both explicitly and implicitly, and may be utilized for various performance or efficiency benefits as described herein related to factors such as bandwidth, disk, processing, or memory.

FIG. 7 illustrates an example 700 of encoded text data management using a set of encoded text data types, according to embodiments. Example 700 illustrates a real text encoding example. The real text encoding example "This is a test for 中文". As such, storage space may be used efficiently if a page of text content, similar to the example, has a plurality of different encodings. Aspects can provide such efficiency while managing the overall number of encoding spaces that are utilized.

Altogether, aspects of the disclosure relate to displaying languages on computing devices. Various character encoding methodologies may be utilized to display multiple different language. The various character encoding methodologies utilize varying amounts of storage space. Disclosed aspects include an encoding methodology which can utilize predefined prefixes and a mapping table. The encoding methodology may be encoded from and decoded to with application embedded encoding. Features can calculate a continuous word count a set of data such as a language of text to compute a number of word count bits for utilization. Aspects may efficiently use storage space when a page of text content has many different encodings. A utilized number of encoding spaces may be managed to be held below a threshold number of encoding spaces.

In addition to embodiments described above, other embodiments having fewer operational steps, more operational steps, or different operational steps are contemplated. Also, some embodiments may perform some or all of the above operational steps in a different order. The modules are listed and described illustratively according to an embodiment and are not meant to indicate necessity of a particular module or exclusivity of other potential modules (or functions/purposes as applied to a specific module).

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Embodiments according to this disclosure may be provided to end-users through a cloud-computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud-computing resources are provided to a user on a pay-per-use basis, where users are charged only for the computing resources actually used (e.g., an amount of storage space used by a user or a number of virtualized systems instantiated by the user). A user can access any of the resources that reside in the cloud at any time, and from anywhere across the Internet. In context of the present disclosure, a user may access applications or related data available in the cloud. For example, the nodes used to create a stream computing application may be virtual machines hosted by a cloud service provider. Doing so allows a user to access this information from any computing system attached to a network connected to the cloud (e.g., the Internet).

Embodiments of the present disclosure may also be delivered as part of a service engagement with a client corporation, nonprofit organization, government entity, internal organizational structure, or the like. These embodiments may include configuring a computer system to perform, and deploying software, hardware, and web services that implement, some or all of the methods described herein. These embodiments may also include analyzing the client's operations, creating recommendations responsive to the analysis, building systems that implement portions of the recommendations, integrating the systems into existing processes and infrastructure, metering use of the systems, allocating expenses to users of the systems, and billing for use of the systems.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to exemplary embodiments, other and further embodiments of the invention may be devised without departing from the basic scope thereof, and the scope thereof is determined by the claims that follow. The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. "Set of," "group of," "bunch of," etc. are intended to include one or more. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

What is claimed is:

1. A computer-implemented method of encoded text data management, the method comprising:
   identifying, by a processor, a first set of text data of a first text data type;
   identifying, by the processor, a second set of text data of a second text data type;
   determining, by the processor, a first encoding scheme associated with the first text data type and a second encoding scheme associated with the second text data type; and
   executing, by the processor and using both the first encoding scheme and the second encoding scheme, an encoded data management operation with respect to the first set of text data and the second set of text data.

2. The method of claim 1, wherein the first set of text data and the second set of text data are subsets of a single set of text data contained in a document, wherein the first text data type corresponds to a first language, and wherein the second text data type corresponds to a second language.

3. The method of claim 2, wherein the executing the encoded data management operation includes:
   generating a first set of encoded text data by encoding the first set of text data using the first encoding scheme;
   generating a second set of encoded text data by encoding the second set of text data using the second encoding scheme; and
   generating an encoded document for the single set of text data using the first set of encoded text data and the second set of encoded text data.

4. The method of claim 3, wherein generating the encoded document comprises:
   generating a first set of indicator bits for the first set of encoded text data, the first set of indicator bits identifying the first encoding scheme and a size of the first set of encoded text data;
   generating a second set of indicator bits for the second set of encoded text data, the second set of indicator bits identifying the second encoding scheme and a size of the second set of encoded text data; and
   combining at least the first set of indicator bits, the first set of encoded text data, the second set of indicator bits, and the second set of encoded text data.

5. The method of claim 3, the method further comprising:
   generating a mapping data structure, wherein the mapping data structure links each language of a plurality of supported languages to a corresponding encoding scheme and set of indicator bits; and
   storing the encoded document in a computer memory.

6. The method of claim 2, wherein the first encoding scheme is associated with the first language and the second encoding scheme is associated with the second language.

7. The method of claim 2, wherein the document is an encoded document, wherein the first set of text data and the second set of text data are sets of encoded text data, and wherein executing the encoded data management operation includes:
   determining that the first set of encoded text data is encoded using the first encoding scheme and that the second set of encoded text data is encoded using the second encoding scheme;
   decoding the encoded text document; and
   displaying the decoded text document.

8. The method of claim 7, wherein decoding the encoded text document includes decoding the first set of encoded text data according to the first encoding scheme and decoding the second set of encoded text data according to the second encoding scheme.

9. The method of claim 7, wherein determining that the first set of encoded text data is encoded using the first encoding scheme and that the second set of encoded text data is encoded using the second encoding scheme includes:
   identifying a first set of indicator bits in the encoded document, the first set of indicator bits identifying the first encoding scheme and a number of words N in the first set of encoded text data; and
   identifying a second set of indicator bits in the encoded document, the second set of indicator bits identifying the second encoding scheme and a number of words M in the second set of encoded text data.

10. The method of claim 9, wherein decoding the encoded text document includes:
    decoding the first N words that follow the first set of indicator bits in the encoded document according to the first encoding scheme; and
    decoding the first M words that follow the second set of indicator bits in the encoded document according to the second encoding scheme.

11. The method of claim 2, wherein the document is a web page.

12. The method of claim 2, wherein the first and second encoding schemes are selected from a group consisting of: ASCII, Big5, UTF-8, UTF-16, EUC-KR, Shift_JS, and GB18030.

13. A system of encoded text data management, the system comprising:
    a memory; and
    a processor communicatively coupled to the memory, wherein the processor is configured to perform a method comprising:
    identifying a first subset of text data of a first text data type in a set of text data in a document;
    identifying a second subset of text data of a second text data type in the set of text data;
    determining a first encoding scheme associated with the first text data type and a second encoding scheme associated with the second text data type; and
    executing, using both the first encoding scheme and the second encoding scheme, an encoded data management operation with respect to the first subset of text data and the second subset of text data.

14. The system of claim 13, wherein the executing the encoded data management operation includes:
    generating a first set of encoded text data by encoding the first subset of text data using the first encoding scheme;

generating a first set of indicator bits for the first set of encoded text data, the first set of indicator bits identifying the first encoding scheme and a size of the first set of encoded text data;

generating a second set of encoded text data by encoding the second subset of text data using the second encoding scheme;

generating a second set of indicator bits for the second set of encoded text data, the second set of indicator bits identifying the second encoding scheme and a size of the second set of encoded text data; and combining at least the first set of indicator bits, the first set of encoded text data, the second set of indicator bits, and the second set of encoded text data generate to an encoded document.

15. The system of claim 13, wherein the method performed by the processor further comprises:

generating a mapping data structure, wherein the mapping data structure links each language of a plurality of supported languages to a corresponding encoding scheme and set of indicator bits.

16. The system of claim 15, wherein determining the first encoding scheme associated with the first text data type and the second encoding scheme associated with the second text data type includes:

determining that the first text data type indicates that the first subset of text data includes text of a first language;

determining that the second text data type indicates that the second subset of text data includes text of a second language; and determining that the first encoding scheme is associated with the first language and that the second encoding scheme is associated with the second language using the mapping data structure.

17. A computer program product of encoded text data management, the computer program product comprising a computer readable storage medium having program instructions embodied therewith, wherein the computer readable storage medium is not a transitory signal per se, the program instructions executable by a processor to cause the processor to perform a method comprising:

identifying a first subset of text data of a first text data type in a set of text data in a document;

identifying a second subset of text data of a second text data type in the set of text data;

determining a first encoding scheme associated with the first text data type and a second encoding scheme associated with the second text data type; and executing, using both the first encoding scheme and the second encoding scheme, an encoded data management operation with respect to the first subset of text data and the second subset of text data.

18. The computer program product of claim 17, wherein the document is an encoded document, wherein the first subset of text data and the second subset of text data are encoded text data, and wherein executing the encoded data management operation includes:

determining that the first subset of text data is encoded using the first encoding scheme and that the second subset of text data is encoded using the second encoding scheme;

decoding the encoded text document; and displaying the decoded text document.

19. The computer program product of claim 18, wherein the method performed by the processor further comprises:

identifying a first set of indicator bits in the encoded document, the first set of indicator bits identifying the first encoding scheme and a number of words N in the first set of encoded text data; and identifying a second set of indicator bits in the encoded document, the second set of indicator bits identifying the second encoding scheme and a number of words M in the second set of encoded text data.

20. The computer program product of claim 19, wherein decoding the encoded text document includes:

decoding the first N words that follow the first set of indicator bits in the encoded document according to the first encoding scheme; and decoding the first M words that follow the second set of indicator bits in the encoded document according to the second encoding scheme.

\* \* \* \* \*